(12) United States Patent
Rorane et al.

(10) Patent No.: US 10,658,307 B2
(45) Date of Patent: May 19, 2020

(54) CONTROL OF WARPAGE USING ABF GC CAVITY FOR EMBEDDED DIE PACKAGE

(71) Applicant: Intel Corporation, Santa Clara, CA (US)

(72) Inventors: Digvijay A. Rorane, Chandler, AZ (US); Ian En Yoon Chin, Georgetown (MY); Daniel N. Sobieski, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/948,958

(22) Filed: Apr. 9, 2018

(65) Prior Publication Data

US 2018/0301423 A1 Oct. 18, 2018

Related U.S. Application Data

(62) Division of application No. 14/491,892, filed on Sep. 19, 2014, now Pat. No. 9,941,219.

(51) Int. Cl.
*H01L 21/76* (2006.01)
*H01L 23/00* (2006.01)
(Continued)

(52) U.S. Cl.
CPC ............ *H01L 23/562* (2013.01); *H01L 21/50* (2013.01); *H01L 23/498* (2013.01);
(Continued)

(58) Field of Classification Search
CPC ............ H01L 21/768; H01L 21/76816; H01L 21/76838; H01L 23/562; H01L 24/19;
(Continued)

(56) References Cited

U.S. PATENT DOCUMENTS

| 7,937,828 B2 | 5/2011 | Yamano |
| 8,618,652 B2 | 12/2013 | Nalla et al. |

(Continued)

FOREIGN PATENT DOCUMENTS

| CN | 101480116 | 7/2009 |
| CN | 103715104 | 4/2014 |

(Continued)

OTHER PUBLICATIONS

Office Action for Chinese Application No. 201510511986.3, dated Sep. 5, 2017, 11 pages.

(Continued)

*Primary Examiner* — Moin M Rahman
(74) *Attorney, Agent, or Firm* — Schwabe, Williamson & Wyatt, P.C.

(57) ABSTRACT

Embodiments include semiconductor device packages and methods of forming such packages. In an embodiment, the package may include a die-side reinforcement layer with a cavity formed through the die-side reinforcement layer. A die having a first side and an opposite second side comprising a device side may be positioned in the cavity with the first side of the die being substantially coplanar with a first side of the die-side reinforcement layer. In an embodiment, a build-up structure may be coupled to a second side of the die. Embodiments include a build-up structure that includes a plurality of alternating layers of patterned conductive material and insulating material.

20 Claims, 7 Drawing Sheets

(51) Int. Cl.
*H01L 21/50* (2006.01)
*H01L 23/498* (2006.01)
*H01L 23/31* (2006.01)

(52) U.S. Cl.
CPC .. *H01L 23/49816* (2013.01); *H01L 23/49822* (2013.01); *H01L 24/19* (2013.01); *H01L 24/20* (2013.01); *H01L 23/3121* (2013.01); *H01L 2224/04105* (2013.01); *H01L 2224/12105* (2013.01); *H01L 2224/18* (2013.01); *H01L 2924/18162* (2013.01); *H01L 2924/3511* (2013.01)

(58) Field of Classification Search
CPC ............... H01L 24/20; H01L 23/49822; H01L 23/49816; H01L 23/498; H01L 21/50; H01L 2924/3511; H01L 2924/18162; H01L 2224/12105; H01L 2224/04105; H01L 23/3121; H01L 2224/18; H01L 21/28026; H01L 21/823475; H01L 21/823871; H01L 23/552; H01L 25/16; H01L 27/14636; H01L 2224/19; H01L 2224/25; H01L 2225/06541; H01L 24/01; H01L 24/15; H01L 24/16; H01L 24/17; H01L 24/76; H01L 24/82; H01L 2224/76; H01L 2224/82; H01L 2224/82007; H01L 2224/821; H01L 2225/06513; H01L 2924/014; H01L 23/488; H01L 33/62
USPC ....... 257/774, 522, 419, 773, 758, 737, 499, 257/762, 764, 506; 438/15, 25–26, 51, 438/55, 64, 106
See application file for complete search history.

(56) References Cited

U.S. PATENT DOCUMENTS

| | | | |
|---|---|---|---|
| 9,385,102 | B2 | 7/2016 | Lin et al. |
| 2007/0045811 | A1 | 3/2007 | Machida et al. |
| 2007/0074900 | A1 | 4/2007 | Lee et al. |
| 2007/0132072 | A1 | 6/2007 | Chang |
| 2007/0246744 | A1 | 10/2007 | Chen et al. |
| 2007/0284704 | A1 | 12/2007 | Leal et al. |
| 2008/0006936 | A1* | 1/2008 | Hsu ............. H01L 23/5389 257/731 |
| 2008/0296056 | A1 | 4/2008 | Kinoshita et al. |
| 2008/0164597 | A1 | 7/2008 | Hsu |
| 2009/0246909 | A1 | 10/2009 | Takeuchi et al. |
| 2010/0044845 | A1 | 2/2010 | Funaya et al. |
| 2011/0227214 | A1 | 9/2011 | Tateiwa |
| 2011/0241187 | A1 | 10/2011 | Guo |
| 2011/0241215 | A1 | 10/2011 | Sankman |
| 2011/0254124 | A1 | 10/2011 | Nalla |
| 2011/0316148 | A1 | 12/2011 | Kondo |
| 2012/0139116 | A1 | 6/2012 | Manusharow |
| 2012/0161316 | A1* | 6/2012 | Gonzalez ............. H01L 25/50 257/738 |
| 2013/0200516 | A1 | 8/2013 | Nakatani |
| 2014/0175657 | A1 | 6/2014 | Oka et al. |
| 2015/0001731 | A1* | 1/2015 | Shuto ............. H01L 25/117 257/774 |

FOREIGN PATENT DOCUMENTS

| | | |
|---|---|---|
| CN | 103887281 | 6/2014 |
| JP | 2002-16173 | 1/2002 |
| JP | 2002-016173 | 1/2002 |
| JP | 2002-111226 | 4/2002 |
| JP | 2007-48868 | 2/2007 |
| JP | 2007-59821 | 9/2008 |
| JP | 2008-300636 | 12/2008 |
| JP | 2013-115136 | 6/2013 |
| JP | 2013-524491 | 6/2013 |
| WO | WO 2007126090 | 11/2007 |

OTHER PUBLICATIONS

Office Action for Chinese Application No. 201510511986.3, dated May 22, 2018, 8 pages.
Office Action for Great Britain Application No. 1514666.5, dated Jan. 21, 2016, 5 pages.
Office Action for Great Britain Application No. 1514666.5, dated Oct. 28, 2016 4 pages.
Notice of Allowance for Great Britain Application No. 1514666.5, dated Feb. 16, 2018, 2 pages.
Office Action for Great Britain Application No. 1614003.0, dated Oct. 28, 2016, 2 pages.
Notice of Allowance for Great Britain Application No. 1614003.0, dated Feb. 16, 2018, 2 pages.
Office Action for Japanese Application No. 2015-151066, dated Jun. 7, 2016, 8 pages.
Office Action for Japanese Application No. 2015-151066, dated Mar. 14, 2017, 3 pages.
Office Action for Japanese Application No. 2015-151066, dated Jan. 11, 2016, 10 pages.
Notice of Allowance for Japanese Application No. 2015-151066, dated Aug. 1, 2017, 1 pages.
Notice of Allowance for Taiwan Application No. 104125805, dated May 30, 2010, 4 pages.
Office Action for Chinese Patent Application No. 201510511986.3, dated Dec. 10, 2018, 3 pages.

* cited by examiner

US 10,658,307 B2

CONTROL OF WARPAGE USING ABF GC CAVITY FOR EMBEDDED DIE PACKAGE

CROSS-REFERENCE TO RELATED APPLICATIONS

This application is a Divisional of U.S. patent application Ser. No. 14/491,892, filed on Sep. 19, 2014, the entire contents of which are hereby incorporated by reference herein.

FIELD OF THE INVENTION

Embodiments generally relate to semiconductor devices. More specifically, embodiments relate to methods and apparatuses for packaging semiconductor dies.

BACKGROUND OF THE INVENTION

Reductions in the thickness (i.e., Z-height) of semiconductor packages are largely the result of thinner substrates and dies. However, as the substrates and dies continue to shrink in thickness, the amount of warpage increases. The warpage is inherently caused by the coefficient of thermal expansion (CTE) mismatch between the substrate and the die. For example, a typical package substrate may have a CTE of approximately 20 ppm, whereas the CTE of a silicon die is approximately 3.0 ppm.

Semiconductor dies are packaged with a package assembly process. To increase throughput, a plurality of dies may be packaged on a single panel. The panel may then be diced into individual packages, each of which may include a single die. Excess warpage is a significant contributor to multiple assembly issues at both the panel level and after the package has been singulated. As such, if warpage is not adequately controlled, then the package assembly process may have a poor yield. For example, warpage of the package may increase the risk that surface mount technology (SMT) will not be able to reliably mount the package to a printed circuit board (PCB). Therefore, warpage control is needed throughout the entire semiconductor die package assembly process.

For example, losses in yield and reductions in throughput may occur when a warped panel cannot be loaded properly into a processing tool or a panel carrier because the panel loading and unloading equipment are not be able to handle the warped panel. Also, a warped panel makes processes that rely on a depth of focus unreliable. For example, markings made on the panel with a laser may be incorrect because the warped surface causes some regions of the panel to be out of focus. Additionally, panel readers that check strip identification marks may not be able to accurately read an identification mark that is located on a portion of the panel that is warped. Furthermore, when warpage is present, attachment issues may occur. For example, solder bridging, non-contact opens (NCO), and ball attach issues may be caused by warped packages. Additionally, warpage may increase the difficulty of aligning testing pins.

Several methods to control warpage have been used, but each includes significant drawbacks. In cored packages, metal stiffeners have been attached to the die-side surface of the core. Adding a metal stiffener increases the Z-height of the package and adds additional processing operations which reduce throughput and increase cost. In coreless packages, such as bumpless build-up layer (BBUL) packaging, a cavity copper foil architecture has been utilized. However, such packages may require six or more additional processing operations.

FIGS. 1A-1E are illustrations of a process utilizing cavity copper foil architecture. First, in FIG. 1A, an etchstop layer 101 is formed over the surfaces of the BBUL core 102, and a copper foil layer 103 is laminated over the etchstop layers 101. An etchstop layer 101 is needed when a cavity copper foil architecture is used in order to prevent the core from being etched away during the formation of the cavity. Then in FIG. 1B, a dry film resist (DFR) layer 104 is laminated over the copper foil layer 103. The DFR layer 104 is then patterned with exposure and DFR etching processes, as shown in FIG. 1C. Referring now to FIG. 1D, the exposed copper foil 103 is etched away to form a cavity 120. After the cavity 120 is formed, the DFR film 104 may be stripped. Finally, a die 130 may be mounted to the etchstop layer 101 and a dielectric layer 105 may be laminated over the top surfaces of the die 130 and the copper foil 103, as shown in FIG. 1E. Accordingly, the additional processing operations needed for cavity copper foil architecture severely reduces throughput and increases the cost of production.

DETAILED DESCRIPTION OF THE INVENTION

Figure 1A:
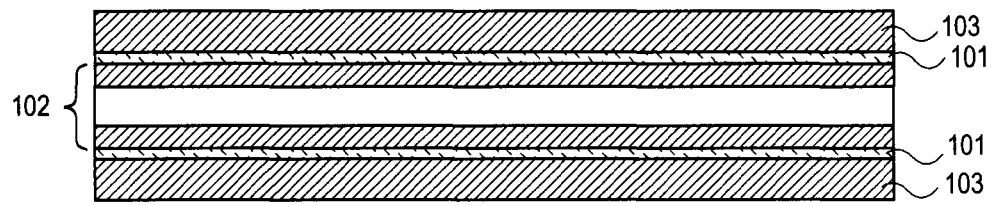
FIGS. 1A-1E are cross-sectional illustrations of a process for forming a die package with a cavity copper foil architecture.
Figure 1B:
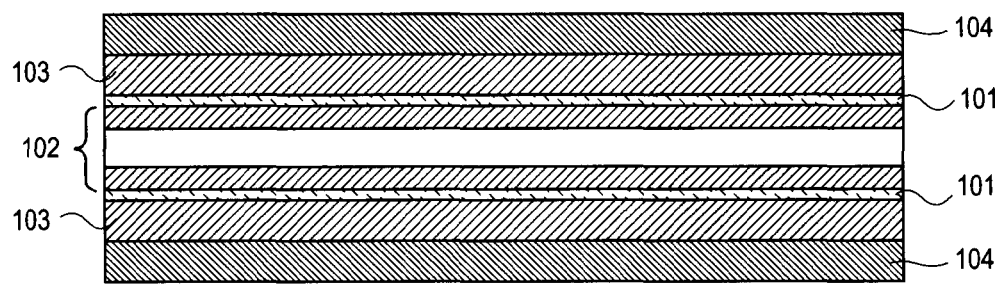
Figure 1C:
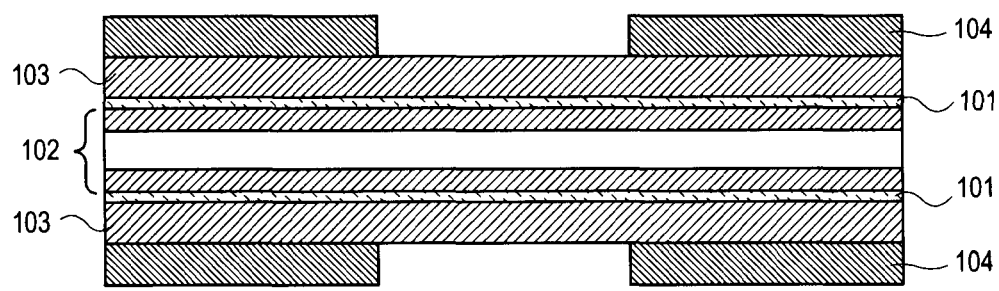
Figure 1D:
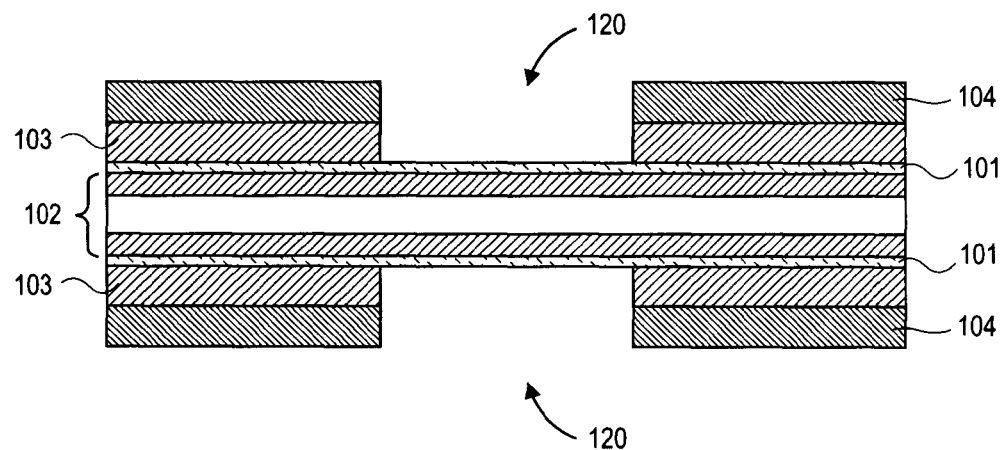
Figure 1E:
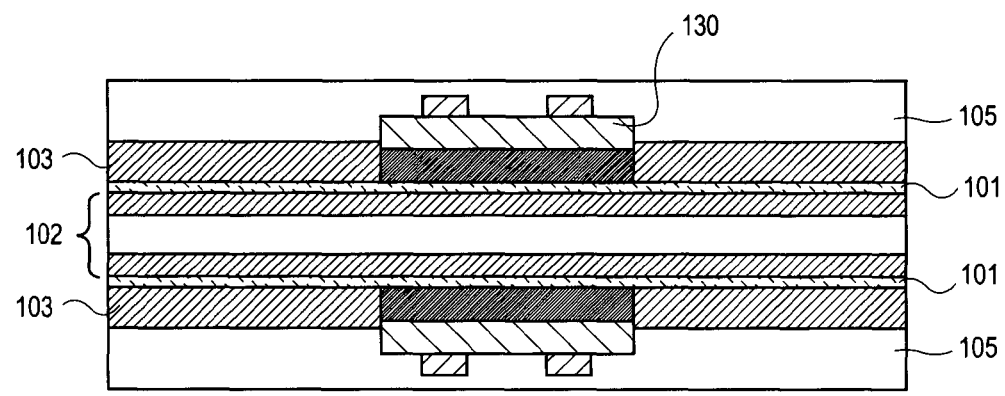

Embodiments of the invention provide apparatuses with improved warpage control for device packages and methods of forming such devices.

According to an embodiment of the invention, a device package may include a die-side reinforcement layer that has a first side and an opposite second side. For example, the die-side reinforcement layer may be a glass cloth layer. In an embodiment, a cavity is formed through the die-side reinforcement layer, and a die having a first side and an opposite second side including a device side with contacts is positioned in the cavity. According to an embodiment, the first side of the die is substantially coplanar with the first side of the die-side reinforcement layer. Embodiments also may include a build-up structure coupled to a second side of the die. For example, the build-up structure may include a plurality of alternating layers of patterned conductive material and insulating material with at least one of the layers of patterned conductive material being coupled to one of the contacts of the die.

According to an additional embodiment of the invention, a method for forming a device package may include forming a die-side reinforcement layer over a surface of a core. For example, the die-side reinforcement layer may be a glass cloth layer. The method may further include forming a cavity through the die-side reinforcement layer to expose a portion of the surface of the core. In an embodiment, the cavity is formed with a laser ablation process. For example, a laser may be used to skive portions of the die-side reinforcement layer until the surface of the core is exposed. In an embodiment, a die may be mounted to the exposed surface of the core. The die may include a first side and an opposite second side that includes a device side with contacts.

Embodiments of the invention provide a decrease in warpage during the entire device packaging process, including when each package is still mounted to a panel and when the device packages have been singulated. Warpage reduction during the packaging process is provided by the use of a reinforcement layer on the die-side of the package. The die-side reinforcement layer provides increased stiffness to the package. Warpage in the package is also reduced when a die-side reinforcement layer is included because the CTE of the reinforcement layer is lower than the CTE of the dielectric layers used in the package. Additionally, the presence of the reinforcement layer on the die-side of the package provides improved symmetry in the CTE of the package when a reinforcement layer is also used in or above the build-up structure.

According to embodiments of the invention, the presence of a die-side reinforcement layer in a package may reduce the absolute quarter-panel warpage by approximately 40% compared to a substantially similar package that does not include a die-side reinforcement layer. When a die-side reinforcement layer is not included in the die package, the warpage is mainly caused by the non-die region warping convexly due to the presence of a low CTE upper reinforcement layer. Without an additional low CTE reinforcement layer on the die-side of the package, the symmetry of the CTE in the package is poor and warpage increases. The addition of the die-side reinforcement layer improves the symmetry of the CTE in the layers of the package and also increases the stiffness. As such, the warpage is reduced and results in a much flatter overall quarter-panel profile that is easier to process. Accordingly, throughput and yield may be increased as a result of the reduction in warpage.

Similarly, the warpage of a singulated die package with a die-side reinforcement layer according to embodiments of the invention is reduced relative to a substantially similar die package that lacks a die-side reinforcement layer. For example, the presence of a die-side reinforcement layer may reduce the absolute room temperature warpage by approximately 25% and the absolute high temperature warpage by approximately 15%, as compared to a substantially similar package that lacks a die-side reinforcement layer.

Further, embodiments of the invention provide for a decrease in warpage while at the same time reducing the number of processing operations. For example, packages that include cavity copper foil architecture require at least six distinct processing operations, as described above. The increased processing time reduces throughput and increases the cost of production. In contrast, embodiments described herein include a cavity architecture that requires fewer processing operations and tools. As such, embodiments provide a greater throughput and reduced cost of production.

Figure 2A:
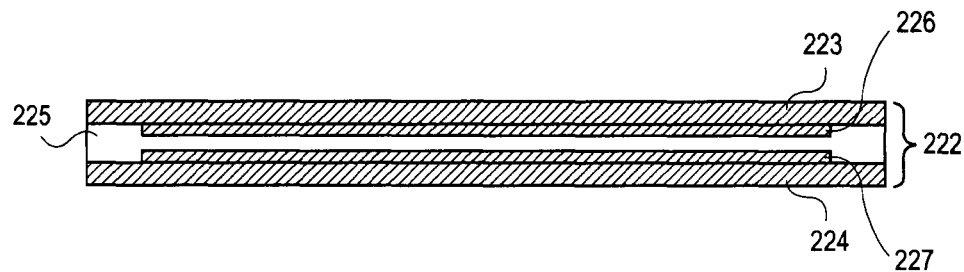
FIGS. 2A-2C are cross-sectional illustrations of a process for forming a die package with a die-side reinforcement layer, according to embodiments of the invention.

Referring now to FIGS. 2A-2H, a method of forming a semiconductor package with reduced warpage is illustrated according to an embodiment. FIG. 2A is a cross-sectional illustration of a portion of a core 222 on which a device package may be formed. In an embodiment, the core 222 may be a core suitable for bumpless build-up layer (BBUL) packaging. For example, the core 222 may include inner foil layers 226, 227 formed on opposite sides of an insulating material 225. For example, the inner foil layers 226, 227 may be a copper foil. First and second core layers 223, 224 may then be formed over each of the inner foil layers 226, 227. According to an embodiment, the inner foil layers 226, 227 may be shorter than the first and second core layers 223. In such an embodiment, the insulating material 225 may adhere to the inner foil layers 226, 227 and first and second core layers 223, 224 in order to secure the inner foil layers 226, 227 to either the first and second core layers 223, 224. In an embodiment, the first and second core layers 223, 224 may be a material typically used for cores, such as copper, and the insulating material 225 may be a pre-preg material.

Figure 2B:
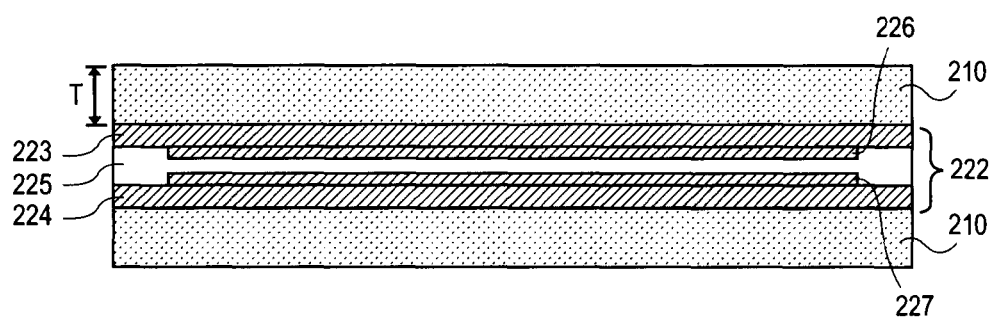

Referring now to FIG. 2B, a die-side reinforcement layer 210 is formed over the surfaces of the first and second core layers 223, 224. In embodiments, the die-side reinforcement layer 210 is formed directly on the first and second core layers 223, 224. According to embodiments, the die-side reinforcement layer 210 may be laminated onto the exposed surfaces of the core 222. In an embodiment, the die-side reinforcement layer 210 is a glass cloth material. For example, the glass cloth may include woven glass fibers that are suspended in an epoxy matrix. Embodiments may also include glass cloth that further includes particulates suspended within the epoxy matrix.

According to an embodiment, the CTE of the die-side reinforcement layer 210 may be tailored to a desired level by altering the volume percentage of the glass fibers and/or the volume percentage of the particulates in the material. For example, the CTE of the die-side reinforcement layer 210 may be between 10 ppm and 40 ppm. Additionally, the weight percentages of the glass fibers and the particulates may be varied in order to increase or decrease the stiffness of the die-side reinforcement layer 210. By way of example, the reinforcement layer 210 may have fibers that account for between 75% and 85% of the weight of the material. According to an additional embodiment, the fibers may comprise approximately 80% of the weight of the reinforcement layer 210.

In an embodiment, the thickness T of the die-side reinforcement layer 210 is chosen to provide a desired level of warpage reduction to the package. For example, a thicker reinforcement layer will provide a greater degree of warpage reduction. However, it should be noted that a thickness T that is chosen to be too large may actually reduce the level of warpage reduction. At a certain point, the increased thickness begins to overcompensate for the warpage that occurs in the package, and may become a source of warpage. For example, if the warpage of a package were concave in nature when no die-side reinforcement layer 210 is present, then the use of an overly thick die-side reinforcement layer 210 may overcompensate for the concave warpage and begin producing warpage that is convex in nature. As those skilled in the art will recognize, the thickness T at which the die-side reinforcement layer 210 begins to overcompensate and become a source of warpage is dependent on many different factors, such as, but not limited to, the geometry of the package, the materials chosen for the packaging layers, and the thickness of the die. Accordingly, embodiments of the invention may include a thickness T of the die-side reinforcement layer 210 that is between approximately 10 μm and 750 μm. Embodiments of the invention may also include a thickness T of the die-side reinforcement layer 210 that is between approximately 50 μm and 150 μm. In an embodiment, the thickness T of the die-side reinforcement layer 210 is dependent on the thickness of the die that will be packaged. For example, the thickness T of the die-side reinforcement layer 210 may be chosen to be approximately the same thickness as the die, thinner than the die, or thicker than the die.

In embodiments, the die-side reinforcement layer 210 may be formed with a single laminated layer of the reinforcement material. Additionally, embodiments may include laminating a plurality of reinforcement material layers to achieve the desired thickness T of the die-side reinforcement layer 210. For example, a first layer of reinforcement material with a thickness of 100 μm may be laminated over the core 222. A second layer of reinforcement material having a thickness of 50 μm may then be laminated over the exposed surface of the first layer of reinforcement material. As such, a die-side reinforcement layer 210 with a thickness T equal to 150 μm may be formed by the combination of the two laminated layers.

Figure 2C:
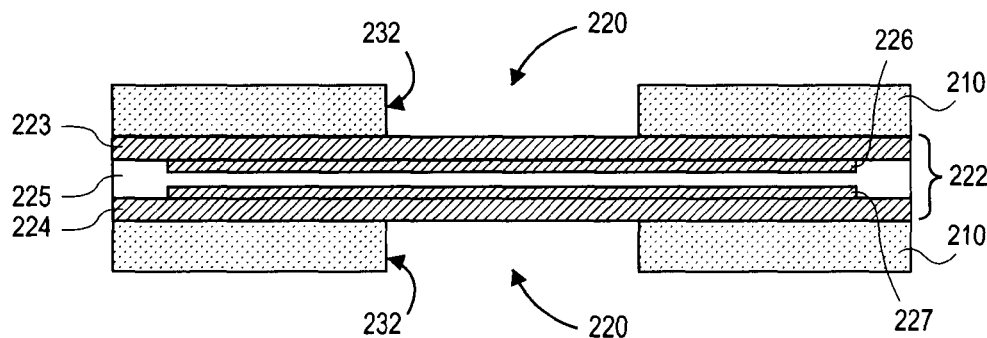

Referring now to FIG. 2C, a cavity 220 is formed through the die-side reinforcement layer 210. In an embodiment, the cavity 220 is formed with a laser ablation process. In an embodiment, the laser radiation may be ultraviolet (UV) laser radiation, and laser radiation source may be a carbon dioxide ($CO_2$) laser, a carbon monoxide (CO) laser, a neodymium doped yttrium aluminum garnet (Nd:YAG) laser in various harmonics, an excimer laser, or any other suitable type of laser radiation source. In other embodiments, laser radiation the laser radiation source may be a continuous laser. Embodiments of the invention include a laser ablation process where the laser skives portions of the die-side reinforcement layer 210 until a surface of the core 222 is exposed. By way of example, the laser skiving process may remove between approximately 1.0 μm and 10 μm per pass. In an embodiment, the laser may remove approximately 6.0 μm of the reinforcement layer 210 during each pass. The skiving process allows for a lower intensity laser to be used in order to remove thinner portions of the material at a time as compared to ablating through the entire thickness. For example, the laser intensity may be set to between approximately 4.0 $J/cm^2$ and 9.0 $J/cm^2$. An embodiment includes passing the laser over the portions of the reinforcement material in a repeating raster pattern until the surface of the core 222 is exposed. According to an additional embodiment, cavities 220 may be formed with a laser projection patterning (LPP) process. LPP may be used in some embodiments to expose the entire selected area without rastering and skiving.

In contrast to the cavity copper foil architecture described above, the cavity is able to be made with minimal processing operations according to embodiments of the invention. Instead of requiring resist formation, resist patterning, copper etching, resist stripping, and additional operations, embodiments are able to utilize the differences in decomposition temperature between the die-side reinforcement layer 210 and the outer layers 223 and 224 of the core 222 to selectively remove portions of the die-side reinforcement layer 210 relative to the core 222. As such, embodiments allow for the complete removal of the die-side reinforcement layer 210 and completely expose the core surface 222. Furthermore, embodiments are able to completely remove the die-side reinforcement material in the cavity 220 without the need for a desmear process.

Figure 2D:
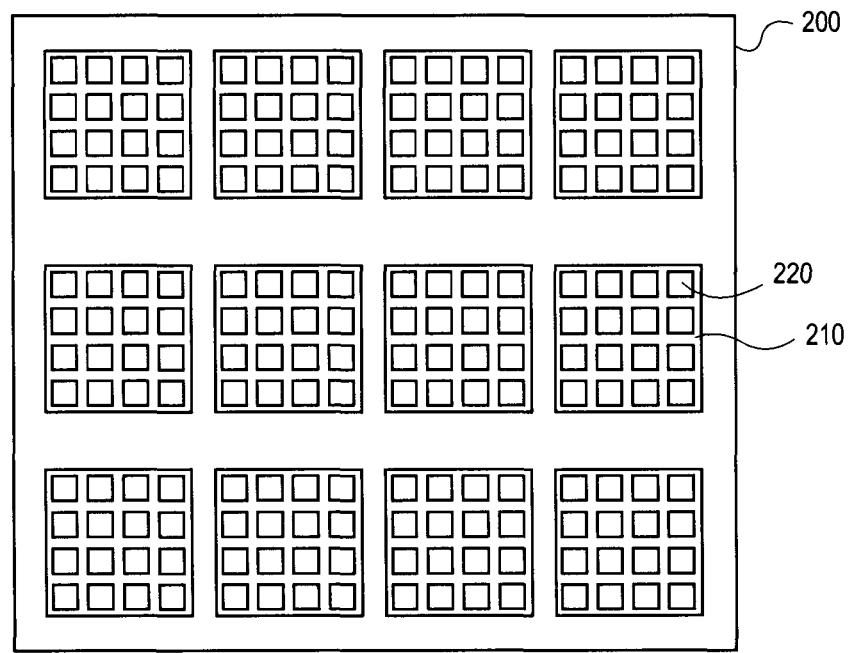
FIG. 2D is an overhead plan view of a quarter panel with cavities formed through the die-side reinforcement layer, according to an embodiment of the invention.

As shown in the overhead plan view illustrated in FIG. 2D, a quarter-panel 200 may include a plurality of cavities 220. In an embodiment, the cavities are substantially rectangular or square, though embodiments are not limited to such configurations. In an embodiment, a single laser is used to form each of the cavities. Additional embodiments may utilize multiple lasers operated concurrently to form cavities 220, thereby further increasing the throughput. In an embodiment, the cavities 220 on a first side of the panel 200 are formed with a laser. Thereafter, the panel 220 may be flipped over and the cavities 220 on the second side of the panel 200 may be formed. In an embodiment, a first laser may be oriented over a first side of the panel 200 and a second laser may be oriented over a second side of the panel 200. In such a configuration, the cavities 220 on both sides of the panel 200 may be formed at substantially the same time in order to increase throughput. In an embodiment, the laser used to form the cavities 220 may also be used to form alignment marks needed for subsequent processing on a top surface of the die-side reinforcement layer 210. Accordingly, a separate tool is not needed to form the alignment marks, and throughput may be increased.

Figure 2E:
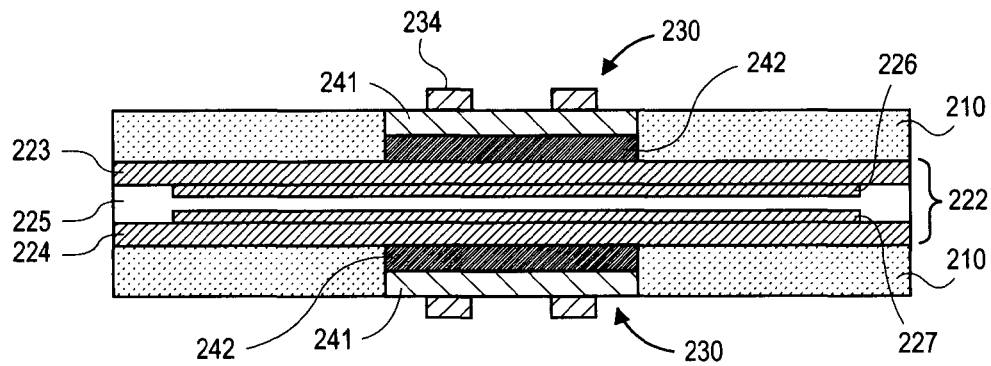
FIGS. 2E-2J are cross-sectional illustrations of a process for forming a die package with a die-side reinforcement layer, according to embodiments of the invention.

Referring now to FIG. 2E, a die 230 is mounted in the cavity 220. In an embodiment, the die 230 may have a first side 241 and a second side 242 opposite the first side. The first side of the die 241 may be bonded to the exposed core surface 222. By way of example, the first side of the die 241 may include a die backside film (DBF). In an embodiment, the DBF may be bonded to the exposed core surface 222. Embodiments include a second side 232 of the die 230 that includes a device side. For example, the device side may include electrical circuitry formed on a semiconductor material, such as silicon. The second side of the die 242 may include contacts 234 that are electrically coupled to the electrical circuitry formed on the device side of the die 230.

According to an embodiment, the thickness of the die 230 may be approximately equal to the thickness of the die-side reinforcement layer 210. In an embodiment, the die 230 may have a thickness that is greater than or less than the thickness of the die-side reinforcement layer 210. Embodiments of the invention may include a die 230 that has a width that is substantially equal to the width of the cavity 220. For example, sidewalls of the die 230 may be in direct contact with the sidewalls 232 of the cavity. Such an embodiments provide improved mechanical continuity to the package and may provide increased warpage control. While the embodiment illustrated in FIG. 2E shows a single die 230 being mounted in the cavity 220, embodiments are not limited to such configurations. For example, two or more dies 230 may be mounted in a single cavity 220. Additionally, embodiments of the invention may include a package with two or more cavities 220. In such an embodiment, one or more dies 230 may be mounted in each of the cavities 220.

Figure 2F:
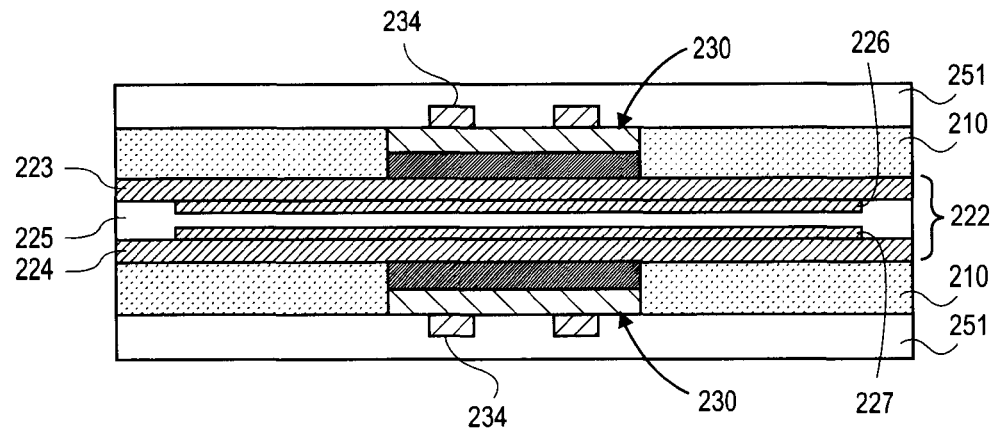

Referring now to FIG. 2F, a dielectric layer 251 may be formed over a top surface of the die-side reinforcement layer 210 and the die 230. In an embodiment, the dielectric layer 251 may be a plurality of films or sheets that are laminated over exposed surfaces of the die-side reinforcement layer 210 and the die 230. Thereafter, in FIG. 2G, a build-up structure including a plurality of patterned conductive traces 263 and vias 264 are formed over the die-side reinforcement layer 210 and the die 230, according to an embodiment. As illustrated, the conductive traces 263 may be electrically isolated from neighboring conductive traces 263 by portions of dielectric material.

Though illustrated as a single layer, the dielectric material 251 may be formed as multiple layers. For example, openings may be formed through a first dielectric layer to provide access to the contacts 234 of the die 230. In an embodiment, the openings through the dielectric layer may be formed with a laser drilling process. Embodiments may further include a desmear process following the laser drilling. A conductive material, such as copper, may then be deposited into the openings to form conductive vias 264. The deposition of the conductive material may also form a layer of conductive material over the exposed surfaces of the dielectric layer 251. In an embodiment, the conductive material is deposited with an electroless plating process. Subsequent to the electroless plating, the conductive material deposited over the surface of the dielectric material may be patterned to form conductive traces 263. In embodiments of the invention, a subsequent layer of dielectric material may be formed over the conductive traces 263 and the laser drilling, via formation, and conductive trace formation may be repeated until the desired number of layers are formed.

In an embodiment, the uppermost layer of the build-up structure may include an upper reinforcement layer 271. In an embodiment, the upper reinforcement layer 271 may be the same material as the die-side reinforcement layer 210. For example, the upper reinforcement layer 271 may be a glass cloth material. In an embodiment, openings are formed through the upper reinforcement layer 271 and a conductive material may be deposited in the openings to form vias 264. A conductive trace 263 may be patterned over an exposed surface of the upper reinforcement layer 271.

Figure 2G:
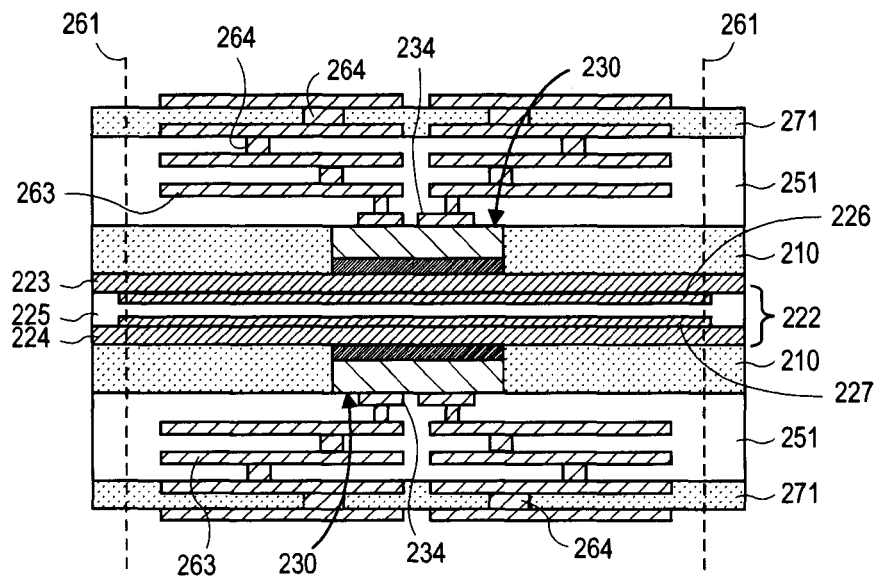
Figure 2H:
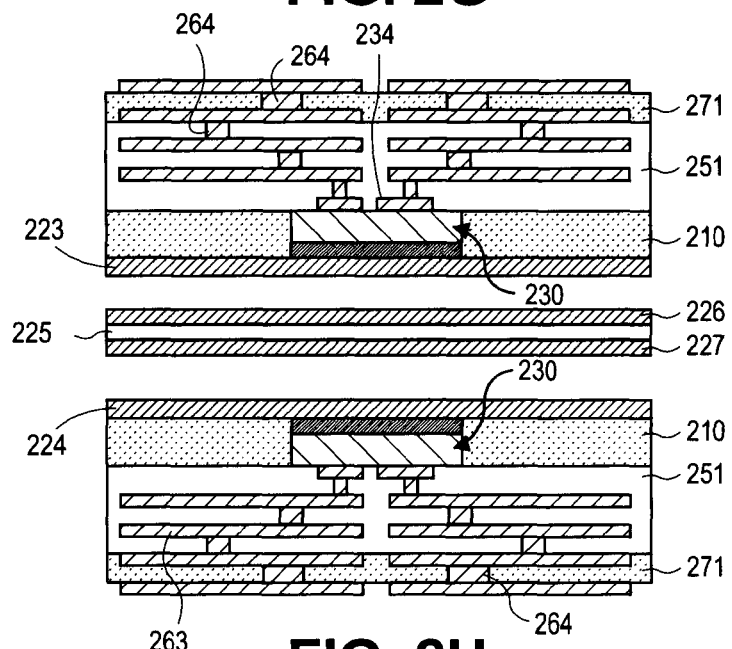

As illustrated in FIG. 2G, a die package with a die mounted in a cavity through the die-side reinforcement layer 210 may be formed over the first and second core layers 223 and 224 of the core 222. In an embodiment, the panel 200 on which the dies are formed may be singulated along lines 261. The singulation removes any adhesive that holds the inner foil layers 226, 227 to the first and second core layers 223, 224. As such, the inner foil layers 226, 227 are detached from the first and second core layers 223, 224, as illustrated in FIG. 2H.

Figure 2I:
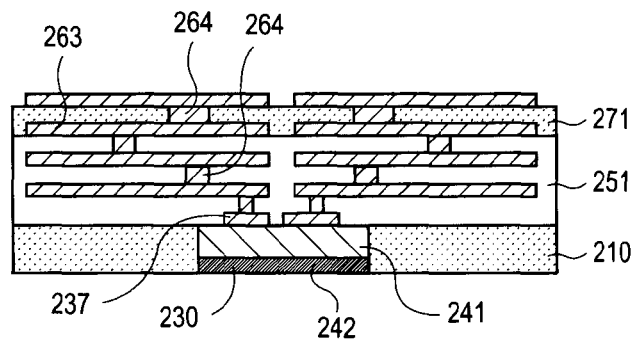

In an embodiment, an etching process may then be utilized to remove the portions of the first and second core layers 223 or 224 of the core 222, as illustrated in FIG. 2I. The etching process to remove the remaining portions of the core 222 from the die package is simplified compared to the core removal etching process needed when a cavity copper foil architecture, such as the one described above, is used. The process is simplified because no etchstop layer is required according to embodiments of the present invention. Instead of bonding the die to the etchstop layer, as is the case in the cavity copper foil architecture, embodiments described herein allow for the die to be bonded directly to the exposed surfaces of the core 223 and 224. As such, an additional etching process needed to remove the etchstop layer is eliminated according to embodiments of the invention, thereby increasing throughput.

Figure 2J:
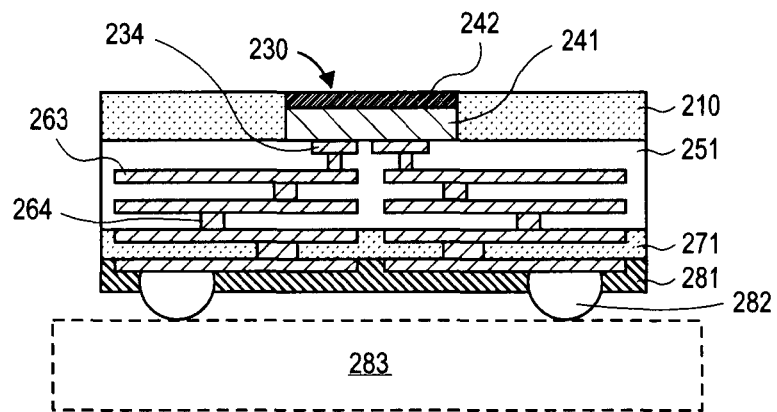

Referring now to FIG. 2J, an additional dielectric layer 281 may be deposited over the exposed patterned traces 263 and patterned to form openings through the dielectric layer 281. In an embodiment, dielectric layer 281 may be a solder resist layer. According to an embodiment, the die package may be electrically coupled to a substrate 283 by solder bumps 282 formed through openings in the solder resist layer. In an embodiment, the substrate 283 may be a printed circuit board (PCB). Though illustrated as being formed subsequent to the singulation process, it is to be appreciated that the solder resist layer may be formed prior to package singulation. For example, the solder resist layer may be formed immediately after the formation of the build-up structure.

Figure 3:
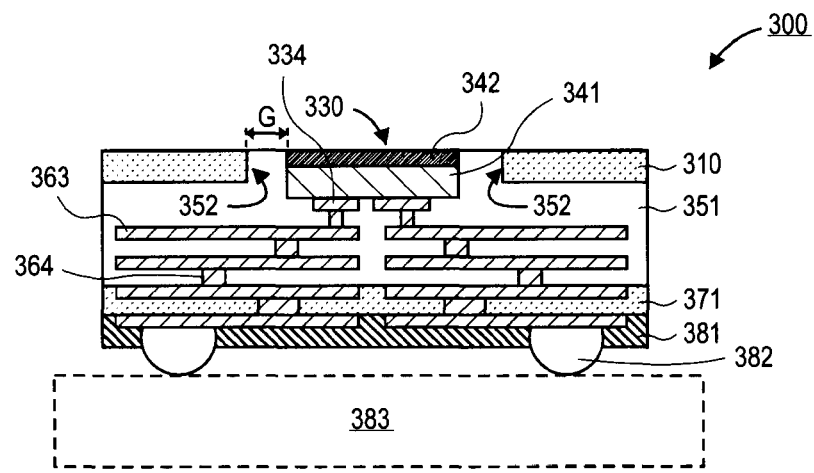
FIG. 3 is a cross-sectional illustration of a semiconductor package formed with a die-side reinforcement layer, according to an embodiment of the invention.

Referring now to FIG. 3, a cross-sectional view of a die package 300 according to an additional embodiment is illustrated. Die package 300 is substantially similar to the die package described above with respect to FIGS. 2A-2J, with the exception that the cavity in the reinforcement layer 310 has a width larger than the width of the die 330. As illustrated, the width of the cavity is chosen such that a gap with a width G is formed between the sidewalls 352 of the cavity and the sidewall of the die 330. In an embodiment, the width G is chosen to provide the desired stiffness to the die package 300 to reduce the warpage. For example, a smaller value of G will provide greater stiffness compared to a larger value of G. According to embodiments of the invention, the width G between the sidewalls 352 and the die 330 may be between 1 μm and 1.0 mm. As illustrated, the gap between the sidewalls 352 and the die 330 may be filled with a dielectric material. For example, the dielectric material may be the same dielectric material used to form the build-up structure.

Figure 4:
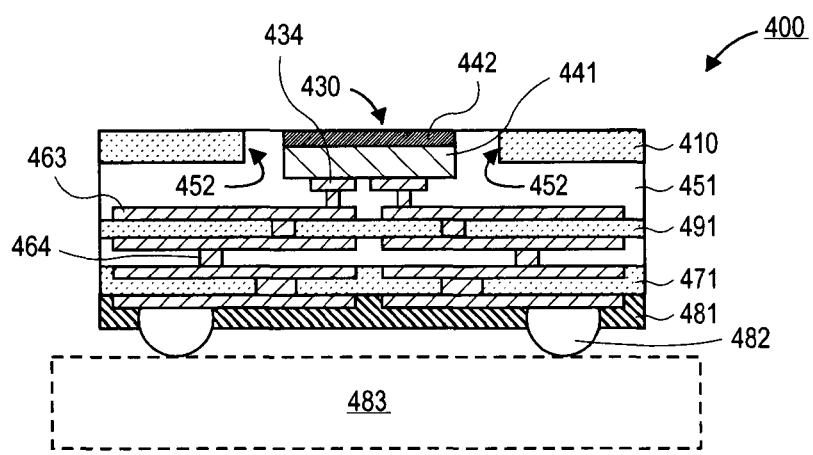
FIG. 4 is a cross-sectional illustration of a semiconductor package formed with a die-side reinforcement layer, according to an embodiment of the invention.

Referring now to FIG. 4, a cross-sectional view of a die package 400 according to an additional embodiment is illustrated. Die package 400 is substantially similar to die package 300 described with respect to FIG. 3, with the exception that an intermediate reinforcement layer 491 is formed in the build-up structure. While a single intermediate reinforcement layer 491 is illustrated, embodiments may include a plurality of intermediate reinforcement layers 491. In an embodiment, an intermediate reinforcement layer 491 may be formed at any position in the package 400 between the die-side reinforcement layer 410 and the upper reinforcement layer 471. In an embodiment, the intermediate reinforcement layer 491 may be the same material as the die-side reinforcement layer 410. For example, the additional reinforcement layer (or layers) 491 may be a glass cloth material. The inclusion of an intermediate reinforcement layer 491 may provide additional stiffness to the die package. As such, the warpage reduction may be further increased, according to such embodiments.

Figure 5:
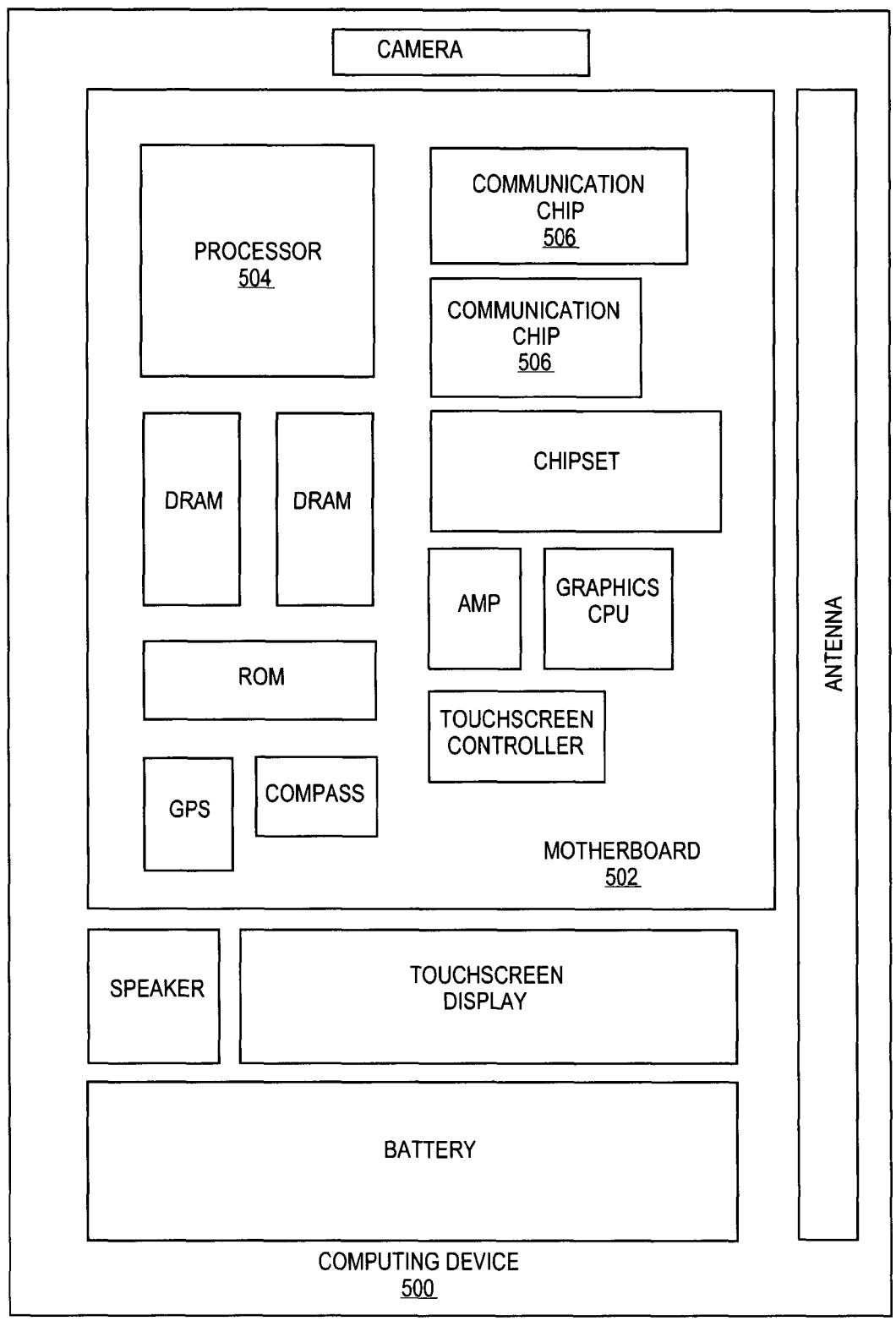
FIG. 5 is an illustration of a schematic block diagram of a computer system that utilizes a semiconductor package, according to an embodiment of the invention.

FIG. 5 illustrates a computing device 500 in accordance with an embodiment. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a microelectromechanical system (MEMS), a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some embodiments, the integrated circuit die of the processor is packaged in a semiconductor package including a reinforcement layer having a cavity formed through the reinforcement layer, in accordance with an embodiment. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another embodiment, the integrated circuit die of the communication chip is packaged in a semiconductor package including a reinforcement layer having a cavity formed through the reinforcement layer, in accordance with an embodiment.

In further implementations, another component housed within the computing device 500 may contain an integrated circuit die that includes one or more devices, such as devices that are packaged in a semiconductor package including a reinforcement layer having a cavity formed through the reinforcement layer, in accordance with an embodiment.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

According to additional embodiments, a package including a reinforcement layer having a cavity formed through the reinforcement layer may also be utilized to package microelectromechanical systems (MEMS). For example, in addition to mounting a die in the cavity, one or more MEMS may be mounted in the cavity.

An embodiment of the invention includes a device package comprising, a die-side reinforcement layer having a first side and an opposite second side, wherein a cavity is formed through the die-side reinforcement layer, a die having a first side and an opposite second side comprising a device side with contacts, wherein the die is positioned in the cavity with the first side of the die being substantially coplanar with the first side of the die-side reinforcement layer, and a build-up structure coupled to a second side of the die, the build-up structure comprising a plurality of alternating layers of patterned conductive material and insulating material, wherein at least one of the layers of patterned conductive material is coupled to one of the contact points of the die. An additional embodiment includes a device package, wherein the die-side reinforcement layer is a glass cloth material. An additional embodiment includes a device package, wherein a gap separates sidewalls of the die from sidewalls of the cavity formed through the die-side reinforcement layer. An additional embodiment includes a device package, wherein a width of the gap is chosen to provide the desired stiffness for the device package. An additional embodiment includes a device package, wherein the width of the gap is between 1.0 µm and 1.0 mm. An additional embodiment includes a device package, wherein the gap separating the sidewalls of the die from the sidewalls of the cavity is filled with an insulative material. An additional embodiment includes a device package, wherein the insulative material filling the gap separating the sidewalls of the die from the sidewalls of the cavity is the same insulating material used in the build-up structure. An additional embodiment includes a device package, wherein a sidewall of the die is in contact with a sidewall of the cavity formed through the die-side reinforcement layer. An additional embodiment includes a device package, wherein the die-side reinforcement layer has a thickness that is less than a thickness of the die. An additional embodiment includes a device package, wherein the first side of the die includes a die backside film (DBF), wherein a surface of the DBF is substantially coplanar with the first side of the die-side reinforcement layer. An additional embodiment includes a device package, wherein the die-side reinforcement layer comprises a plurality of layers stacked on each other. An additional embodiment includes a device package, wherein the build-up structure further comprises one or more intermediate glass cloth reinforcement layers. An additional embodiment includes a device package, further comprising a plurality of dies having a first side and an opposite second side comprising a device side with contacts, wherein the plurality of dies is positioned in the cavity with the first side of the second die being substantially coplanar with the first side of the die-side reinforcement layer. An additional embodiment includes a device package, further comprising a plurality of cavities formed through the die-side reinforcement layer, wherein one or more dies are positioned in each of the plurality of cavities.

An embodiment of the invention includes a method for forming a device package, comprising forming a die-side reinforcement layer over a surface of a core, forming a cavity through the die-side reinforcement layer to expose a portion of the surface of the core, and mounting a die having a first side and an opposite second side comprising a device side with contacts to the exposed surface of the core, wherein the die is positioned in the cavity with the first side of the die contacting the surface of the core. An additional embodiment includes a method for forming a device package, wherein the cavity through the die-side reinforcement layer is formed by a laser ablation process. An additional embodiment includes a method for forming a device package, wherein the laser ablation process includes skiving portions of the die-side reinforcement layer in a repeating raster pattern until the surface of the core is exposed. An additional embodiment includes a method for forming a device package, wherein the laser used in the laser ablation process is a carbon dioxide ($CO_2$) laser, a carbon monoxide (CO) laser, a neodymium-doped yttrium aluminum garnet (Nd:YAG) laser, or an excimer laser. An additional embodiment includes a method for forming a device package, wherein the laser ablation process skives portions of the die-side reinforcement layer that are approximately 6 µm thick during each pass. An additional embodiment includes a method for forming a device package, wherein the laser ablation process is a laser projection patterning process. An additional embodiment includes a method for forming a device package, further comprising forming a build-up structure over the die-side reinforcement layer and the second side of the die, wherein the build-up structure comprises a plurality of alternating layers of patterned conductive material and insulating material, wherein at least one of the layers of patterned conductive material is coupled to one of the contact points of the die.

An embodiment of the invention includes a method for forming a device package, comprising forming a die-side reinforcement layer over a surface of a core, forming a cavity through the die-side reinforcement layer to expose a portion of the surface of the core with a laser ablation process that includes skiving portions of the die-side reinforcement layer in a repeating raster pattern until the surface of the core is exposed, mounting a die having a first side and an opposite second side comprising a device side with contacts to the exposed surface of the core, wherein the die is positioned in the cavity with the first side of the die contacting the surface of the core, forming a build-up structure over the die-side reinforcement layer and the second side of the die, wherein the build-up structure comprises a plurality of alternating layers of patterned conductive material and insulating material, wherein at least one of the layers of patterned conductive material is coupled to one of the contact points of the die, and removing the core from the bottom surface of the die-side reinforcement layer and the second side of the die with an etching process. An additional embodiment includes a method for forming a device package, wherein the cavity is wider than the width of the die and a gap filled with a dielectric material separates sidewalls of the die from sidewalls of the cavity formed through the die-side reinforcement layer. An additional embodiment includes a method for forming a device package, wherein a width of the gap is chosen to provide the desired stiffness for the device package. An additional embodiment includes a method for forming a device package, further comprising mounting a plurality of dies having a first side and an opposite second side comprising a device side with contacts to the exposed surface of the core, wherein each of the plurality of dies is positioned in the cavity with the first side of the die contacting the surface of the core. An additional embodiment includes a method for forming a device package, further comprising forming a plurality of cavities through the die-side reinforcement layer and mounting one or more dies in each of the plurality of cavities.

What is claimed is:

1. A semiconductor package, comprising:
   a die having a first side and a second side opposite the first side, and the die having a first lateral sidewall and a second lateral sidewall;
   a plurality of conductive contacts at the second side of the die;
   a reinforcement layer having a first portion laterally adjacent to the first lateral sidewall of the die, and the reinforcement layer having a second portion laterally adjacent to the second lateral sidewall of the die, the reinforcement layer comprising glass fibers in an epoxy matrix, and the reinforcement layer having a surface co-planar with the second side of the die;
   a dielectric material on the second side of the die and on the surface of the reinforcement layer;
   a first conductive via through the dielectric material, the first conductive via coupled to a first of the plurality of conductive contacts;
   a second conductive via through the dielectric material, the second conductive via coupled to a second of the plurality of conductive contacts;
   a first conductive trace on the dielectric material, the first conductive trace in contact with the first conductive via;
   a second conductive trace on the dielectric material, the second conductive trace in contact with the second conductive via;
   a first solder bump coupled to the first conductive trace, the first solder bump outside of a periphery of the die and inside a periphery of the reinforcement layer, wherein the first conductive trace extends from inside the periphery of the die to a location vertically over the first solder bump; and
   a second solder bump coupled to the second conductive trace, the second solder bump outside of the periphery of the die and inside the periphery of the reinforcement layer, wherein the second conductive trace extends from inside the periphery of the die to a location vertically over the second solder bump, and wherein there are no solder bumps inside of the periphery of the die.

2. The semiconductor package of claim 1, wherein the reinforcement layer is in direct contact with the die.

3. The semiconductor package of claim 1, wherein the reinforcement layer is spaced apart from the die.

4. The semiconductor package of claim 1, wherein the reinforcement layer completely laterally surrounds the die.

5. The semiconductor package of claim 1, wherein the first solder bump is coupled to the first conductive trace by a third conductive trace.

6. The semiconductor package of claim 5, wherein the second solder bump is coupled to the second conductive trace by a fourth conductive trace.

7. The semiconductor package of claim 1, further comprising a die attach film on the first side of the die.

8. A semiconductor package, comprising:
   a die having a first side and a second side opposite the first side, the die having a first lateral sidewall and a second lateral sidewall, and the die having electronic circuitry on the second side of the die;
   a plurality of conductive contacts electrically coupled to the electronic circuitry of the die;
   a reinforcement layer having a first portion laterally adjacent to the first lateral sidewall of the die, and the reinforcement layer having a second portion laterally adjacent to the second lateral sidewall of the die, the reinforcement layer comprising glass fibers in an epoxy matrix, and the reinforcement layer having a surface co-planar with the second side of the die;
   a dielectric material on the second side of the die and on the surface of the reinforcement layer;
   a first conductive via through the dielectric material, the first conductive via coupled to a first of the plurality of conductive contacts;
   a second conductive via through the dielectric material, the second conductive via coupled to a second of the plurality of conductive contacts;
   a first conductive trace on the dielectric material, the first conductive trace in contact with the first conductive via;

a second conductive trace on the dielectric material, the second conductive trace in contact with the second conductive via;

a first solder bump coupled to the first conductive trace, the first solder bump outside of a periphery of the die and inside a periphery of the reinforcement layer, wherein the first conductive trace extends from inside the periphery of the die to a location vertically over the first solder bump; and a second solder bump coupled to the second conductive trace, the second solder bump outside of the periphery of the die and inside the periphery of the reinforcement layer, wherein the second conductive trace extends from inside the periphery of the die to a location vertically over the second solder bump, and wherein there are no solder bumps inside of the periphery of the die.

9. The semiconductor package of claim 8, wherein the reinforcement layer is in direct contact with the die.

10. The semiconductor package of claim 8, wherein the reinforcement layer is spaced apart from the die.

11. The semiconductor package of claim 8, wherein the reinforcement layer completely laterally surrounds the die.

12. The semiconductor package of claim 8, wherein the first solder bump is coupled to the first conductive trace by a third conductive trace.

13. The semiconductor package of claim 12, wherein the second solder bump is coupled to the second conductive trace by a fourth conductive trace.

14. The semiconductor package of claim 8, further comprising a die attach film on the first side of the die.

15. A semiconductor package, comprising:

a die having a first side and a second side opposite the first side, and the die having a first lateral sidewall and a second lateral sidewall;

a plurality of conductive contacts at the second side of the die;

a reinforcement layer having a first portion laterally adjacent to the first lateral sidewall of the die, and the reinforcement layer having a second portion laterally adjacent to the second lateral sidewall of the die, the reinforcement layer comprising glass fibers in an epoxy matrix, and the reinforcement layer having a surface co-planar with the second side of the die;

a dielectric material on the second side of the die and on the surface of the reinforcement layer;

a first conductive via through the dielectric material, the first conductive via coupled to a first of the plurality of conductive contacts;

a second conductive via through the dielectric material, the second conductive via coupled to a second of the plurality of conductive contacts;

a first conductive trace on the dielectric material, the first conductive trace in contact with the first conductive via;

a second conductive trace on the dielectric material, the second conductive trace in contact with the second conductive via;

a first solder bump electrically coupled to the first conductive trace, the first solder bump outside of a periphery of the die and inside a periphery of the reinforcement layer, wherein the first conductive trace extends from inside the periphery of the die to a location vertically over the first solder bump; and a second solder bump electrically coupled to the second conductive trace, the second solder bump outside of the periphery of the die and inside the periphery of the reinforcement layer, wherein the second conductive trace extends from inside the periphery of the die to a location vertically over the second solder bump, and wherein there are no solder bumps inside of the periphery of the die.

16. The semiconductor package of claim 15, wherein the reinforcement layer is in direct contact with the die.

17. The semiconductor package of claim 15, wherein the reinforcement layer is spaced apart from the die.

18. The semiconductor package of claim 15, wherein the reinforcement layer completely laterally surrounds the die.

19. The semiconductor package of claim 15, wherein the first solder bump is electrically coupled to the first conductive trace by a third conductive trace, and wherein the second solder bump is electrically coupled to the second conductive trace by a fourth conductive trace.

20. The semiconductor package of claim 15, further comprising a die attach film on the first side of the die.

* * * * *